US011696460B2

(12) United States Patent
Song

(10) Patent No.: US 11,696,460 B2
(45) Date of Patent: Jul. 4, 2023

(54) ELECTROLUMINESCENT ELEMENT CAPABLE OF REALIZING HIGH LUMINANCE AND HIGH RESOLUTION AND ELECTROLUMINESCENT DISPLAY DEVICE HAVING SAME

(71) Applicant: LG Display Co., Ltd., Seoul (KR)

(72) Inventor: Moonbong Song, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 317 days.

(21) Appl. No.: 17/113,918

(22) Filed: Dec. 7, 2020

(65) Prior Publication Data

US 2021/0184153 A1 Jun. 17, 2021

(30) Foreign Application Priority Data

Dec. 16, 2019 (KR) .................. 10-2019-0168028

(51) Int. Cl.
*H10K 50/125* (2023.01)
*H10K 50/818* (2023.01)
(Continued)

(52) U.S. Cl.
CPC ......... *H10K 50/125* (2023.02); *H10K 50/818* (2023.02); *H10K 50/828* (2023.02); *H10K 59/12* (2023.02); *H10K 59/38* (2023.02)

(58) Field of Classification Search
CPC ............... H01L 51/5036; H01L 27/322; H01L 27/3244; H01L 51/5218; H01L 51/5234
(Continued)

(56) References Cited

U.S. PATENT DOCUMENTS 7,199,521 B2 4/2007 Ibe
7,548,022 B2 6/2009 Ibe
(Continued)

FOREIGN PATENT DOCUMENTS

JP H10-326580 A 12/1998
JP 2004-265763 A 9/2004
(Continued)

OTHER PUBLICATIONS

Japan Patent Office, Office Action, JP Patent Application No. 2020-208075, dated Jan. 4, 2022, eight pages.
(Continued)

*Primary Examiner* — Xia L Cross
(74) *Attorney, Agent, or Firm* — Fenwick & West LLP

(57) ABSTRACT

An electroluminescent element and an electroluminescent display device having realizing high luminance and high resolution are proposed. The electroluminescent element and an electroluminescent display device includes a first light emitting element provided with a first light emitter emitting light of a first color and a second light emitter emitting light of a second color different from the first color, the first light emitter and the second light emitter being disposed to be adjacent to each other, and a second light emitting element provided with a third light emitter disposed to overlap the first light emitter and the second light emitter and emitting light of a third color different from the first and second colors, wherein light of the first and second colors emitted from the first light emitting element is emitted through the second light emitting element.

17 Claims, 11 Drawing Sheets

(51) Int. Cl.
  *H10K 50/828* (2023.01)
  *H10K 59/12* (2023.01)
  *H10K 59/38* (2023.01)
(58) Field of Classification Search
  USPC .......................................................... 257/40
  See application file for complete search history.

(56) References Cited

U.S. PATENT DOCUMENTS

| | | | |
|---|---|---|---|
| 7,687,983 | B2 | 3/2010 | Lee et al. |
| 8,093,602 | B2 | 1/2012 | Ito |
| 8,207,665 | B2 | 6/2012 | Ibe |
| 8,410,682 | B2 | 4/2013 | Lee et al. |
| 9,219,087 | B2 | 12/2015 | Jinta et al. |
| 9,620,569 | B2 | 4/2017 | Shiratori |
| 10,756,141 | B2 | 8/2020 | Hack et al. |
| 2005/0184659 | A1 | 8/2005 | Ibe |
| 2006/0138418 | A1 | 6/2006 | Lee et al. |
| 2007/0182315 | A1 | 8/2007 | Ibe |
| 2010/0051990 | A1 | 3/2010 | Ibe |
| 2010/0127248 | A1 | 5/2010 | Ito |
| 2010/0144072 | A1 | 6/2010 | Lee et al. |
| 2014/0054556 | A1* | 2/2014 | Park .................... H01L 51/5064 257/40 |
| 2014/0247200 | A1 | 9/2014 | Jinta et al. |
| 2016/0025302 | A1 | 1/2016 | Shiratori |
| 2018/0033839 | A1 | 2/2018 | Hack et al. |
| 2019/0189969 | A1* | 6/2019 | Youn .................... H01L 27/3223 |
| 2020/0357860 | A1 | 11/2020 | Hack et al. |
| 2021/0217829 | A1* | 7/2021 | Hsu ..................... H01L 27/3262 |

FOREIGN PATENT DOCUMENTS

| | | |
|---|---|---|
| JP | 2006-164650 A | 6/2006 |
| JP | 2010-153360 A | 7/2010 |
| JP | 2010-219054 A | 9/2010 |
| JP | 2014-170091 A | 9/2014 |
| JP | 2016-029611 A | 3/2016 |
| KR | 10-2018-0013804 A | 2/2018 |
| WO | WO 2004/068911 | 8/2004 |

OTHER PUBLICATIONS

Office Action, Japan Patent Office Application No. 2020208075, dated Apr. 28, 2022, 6 pages.

* cited by examiner

ELECTROLUMINESCENT ELEMENT CAPABLE OF REALIZING HIGH LUMINANCE AND HIGH RESOLUTION AND ELECTROLUMINESCENT DISPLAY DEVICE HAVING SAME

CROSS-REFERENCE TO RELATED APPLICATIONS

This application claims the benefit of Republic of Korea Patent Application No. 10-2019-0168028 filed on Dec. 16, 2019, the entire contents of which is incorporated herein by reference for all purposes as if fully set forth herein.

BACKGROUND

Field

The present disclosure relates to an electroluminescent element and an electroluminescent display device provided with the same and, more particularly, to an electroluminescent element and an electroluminescent display device capable of realizing high luminance and high resolution.

Description of the Related Art

Recently, various flat panel display devices having reducing weight and volume, which are disadvantages of a cathode ray tube (CRT), have been developed. Examples of such a flat panel display device include a liquid crystal display (LCD), a field emission display (FED), a plasma display panel (PDP), an electroluminescent display, etc.

Among these flat panel display devices, the electroluminescent display device is a self-luminous display device that excites organic compounds to emit light, so that backlight used in LCD is not required, thereby having effects where light weight and thinness are made possible and a manufacturing process may be simplified as well. In addition, with properties of being manufactured at a low temperature, of having a high response speed with 1 ms or less, as well as having low power consumption, wide viewing angle, high contrast, etc., an organic electroluminescent display device is widely used.

However, such an electroluminescent display device has a problem in that luminance is low, because light is emitted using a single light emitting layer as a configuration for emitting light.

SUMMARY

The present disclosure is to provide an electroluminescent element and an electroluminescent display device having the same capable of realizing high luminance and high resolution.

According to the first feature of the present disclosure for achieving the above objective, an electroluminescent element includes a first light emitting element provided with a first light emitter emitting light of a first color and a second light emitter emitting light of a second color different from the first color, the first light emitter and the second light emitter being disposed to be adjacent to each other, and a second light emitting element provided with a third light emitter disposed to overlap the first light emitter and the second light emitter and emitting light of a third color different from the first and second colors, wherein light of the first and second colors emitted from the first light emitting element is emitted through the second light emitting element.

According to the second feature of the present disclosure for achieving the above objective, an electroluminescent element includes a first light emitting element provided with a first light emitter emitting light of a first color, and a second light emitter emitting light of a second color different from the first color, the first light emitter and the second light emitter being disposed to be adjacent to each other, and a second light emitting element provided with a third light emitter disposed to overlap the first light emitter and emitting light of the second color, and a fourth light emitter disposed to overlap the second light emitter and emitting light of a third color, the third light emitter and the fourth light emitter being disposed to be adjacent to each other, wherein light emitted from the first light emitting element is emitted through the second light emitting element.

According to the third feature of the present disclosure for achieving the above objective, an electroluminescent element includes a first light emitting element provided with a first light emitter emitting light of a first color, and a color filter layer disposed to overlap the first light emitter and having a first color filter of a second color different from the first color and a second color filter of a third color different from the first and second colors, the first color filter and the second color filter being disposed to be adjacent to each other, and a second light emitting element provided with a second light emitter disposed to overlap the first light emitter and the color filter layer and emitting light of a fourth color different from the first to third colors, wherein light emitted from the first light emitting element is emitted through the color filter layer and the second light emitting element.

In addition, an electroluminescent display device, of the present disclosure for achieving the above objective, includes a scan line and a data line disposed to cross each other, a switching thin film transistor that switches a data signal supplied through the data line in response to a scan signal supplied through the scan line, a storage capacitor that stores the data signal output from the switching thin film transistor as a data voltage, a driving thin film transistor that supplies a driving current according to the data voltage stored in the storage capacitor, and an electroluminescent element in accordance with the first feature to third feature and emitting light according to the driving current.

According to the electroluminescent display device of the present disclosure, by overlapping and disposing a first light emitting element and a second light emitting element, the light emitted from the first light emitting element is combined with the light emitted from the second light emitting element and emitted to the outside, and thus there is an effect of obtaining light having high luminance and high resolution.

In addition, a single pixel is made to have the light of a first color emitted from the first light emitting element and the light of a second color emitted from the second light emitting element and different from the first color, whereby, there is an effect where the light having high luminance and high resolution may be obtained.

DETAILED DESCRIPTION

Figure 1:
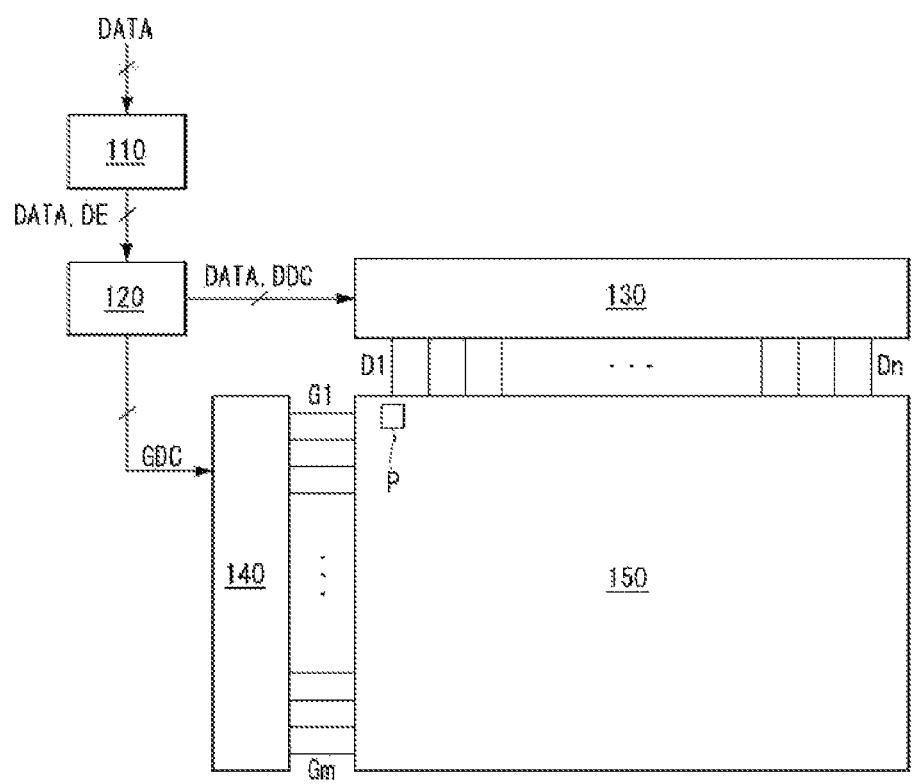
FIG. 1 is a block diagram schematically showing an electroluminescent display device according to an exemplary embodiment of the present disclosure.

Advantages and features of the present disclosure, and methods for accomplishing the same will be more clearly understood from exemplary embodiments described below with reference to the accompanying drawings. However, the present disclosure is not limited to the following exemplary embodiments but may be implemented in various different forms. The exemplary embodiments are provided only to provide a complete disclosure of the present disclosure and to fully provide a person having ordinary skill in the art to which the present disclosure pertains with the scope of the disclosure, and the present disclosure will be defined by the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the present disclosure. Further, in the following description, a detailed explanation of known related technologies may be omitted to avoid unnecessarily obscuring the subject matter of the present disclosure.

The terms such as "including", "having", and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly" is not used.

When the relation of a time sequential order is described using the terms such as "after", "continuously to", "next to", and "before", the order may not be continuous unless the terms are used with the term "immediately" or "directly".

Although the terms first, second, etc. may be used herein to describe various elements, these elements should not be limited by these terms. These terms are only used to distinguish one element, from another element. Therefore, the first element mentioned herein below may be the second element within the technical spirit of the present disclosure.

"X-axis direction", "Y-axis direction", and "Z-axis direction" should not be construed by a geometric relation only of a mutual vertical relation, and may have broader directionality within the range that elements of the present disclosure may act functionally.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

Features of various aspects of the present disclosure may be partially or overall coupled to or combined with each other, and may be variously inter-operated with each other and driven technically as those skilled in the art can sufficiently understand. The aspects of the present disclosure may be carried out independently from each other, or may be carried out together in co-dependent relationship.

Hereinafter, an electroluminescent display device according to the exemplary embodiment of the present disclosure will be described with reference to FIG. 1.

FIG. 1 is a block diagram schematically showing an electroluminescent display device according to the exemplary embodiment of the present disclosure.

Referring to FIG. 1, an organic luminescent display device according to the exemplary embodiment of the present disclosure includes an image processor 110, a timing controller 120, a data driver 130, a scan driver 140, and a display panel 150.

The image processor 110 outputs a data enable signal DE and the like along with a data signal DATA supplied from the outside. The image processor 110 may output one or more of a vertical synchronization signal, a horizontal synchronization signal, and a clock signal in addition to the data enable signal DE, but these signals are omitted for convenience of description.

The timing controller 120 receives a data signal DATA along with a driving signal including the data enable signal DE or the vertical synchronization signal, the horizontal synchronization signal, and the clock signal from the image processor 110. The timing controller 120 outputs a gate timing control signal GDC for controlling operation timing of the scan driver 140 based on the driving signal and a data timing control signal DDC for controlling operation timing of the data driver 130.

The data driver 130 samples and latches the data signal DATA supplied from the timing controller 120 in response to the data timing control signal DDC supplied from the timing controller 120 to convert into and output a gamma reference voltage. The data driver 130 outputs the data signal DATA through data lines D1 to Dn. The data driver 130 may be provided in the form of an integrated circuit (IC).

The scan driver 140 outputs a scan signal while shifting the level of a gate voltage in response to the gate timing control signal GDC supplied from the timing controller 120. The scan driver 140 outputs the scan signal through scan lines G1 to Gm. The scan driver 140 is provided in the form of the integrated circuit (IC) or a gate in panel method on the display panel 150.

The display panel 150 displays an image corresponding to the data signal DATA and the scan signal supplied from the data driver 130 and the scan driver 140.

Next, with reference to FIGS. 2 and 3, a pixel of the electroluminescent display device according to the exemplary embodiment of the present disclosure will be described.

Figure 2:
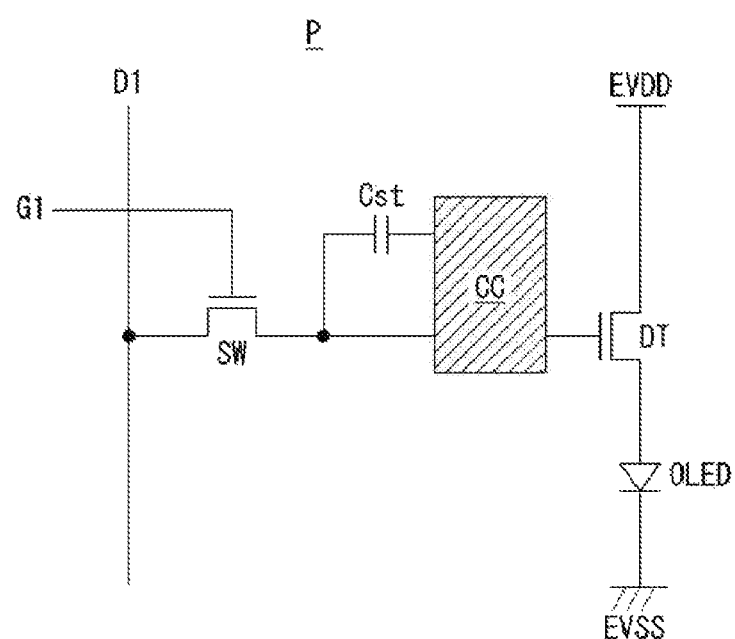
FIG. 2 is a schematic circuit diagram of a pixel of the electroluminescent display device shown in FIG. 1 according to an embodiment of the present disclosure.
Figure 3:
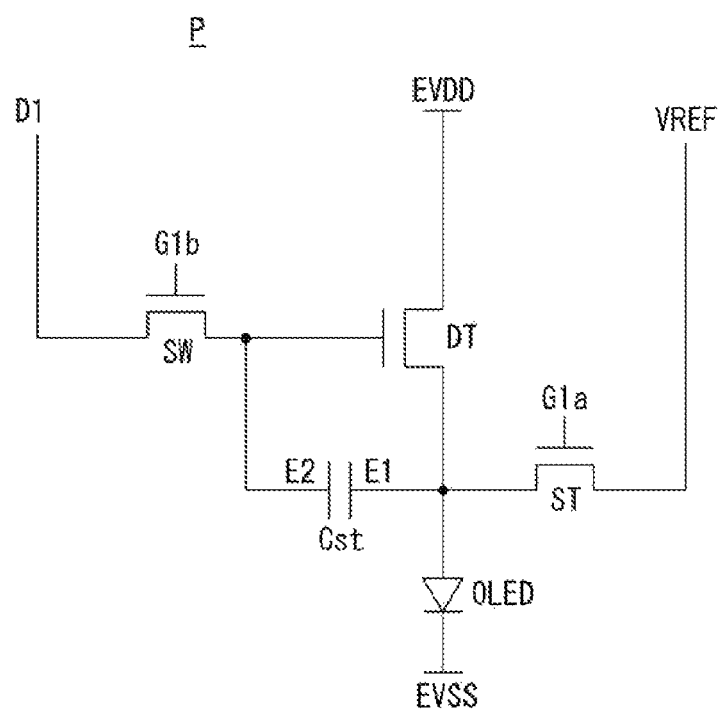
FIG. 3 is an equivalent circuit diagram showing an example of the pixel of the electroluminescent display device shown in FIG. 1 according to an embodiment of the present disclosure.

FIG. 2 is a schematic circuit configuration diagram of a pixel P of the electroluminescent display device shown in FIG. 1 according to an embodiment of the present disclosure, and FIG. 3 is an equivalent circuit diagram showing an example of the pixel P of the electroluminescence display device shown in FIG. 1.

Referring to FIG. 2, in the electroluminescent display device of the present disclosure, each pixel P includes a switching thin film transistor SW, a driving thin film transistor DT, a storage capacitor Cst, a compensation circuit CC, and an organic light emitting diode OLED.

The switching thin film transistor SW performs switching operation for the data signal supplied through a first data line D1 to be stored as a data voltage in the storage capacitor Cst in response to the scan signal supplied through the first scan line G1. The driving thin film transistor DT allows the driving current to flow through between a first power line EVDD and a second power line EVSS according to the data voltage stored in the storage capacitor Cst. The electroluminescent element OLED operates to emit light according to the driving current formed by the driving thin film transistor DT.

The compensation circuit CC is a circuit added in the sub-pixel to compensate for a threshold voltage of the driving thin film transistor DT. The compensation circuit CC may include one or more thin film transistors. The compensation circuit CC may be configured in various ways depending on the compensation method.

Referring to FIG. 3, the compensation circuit CC shown in FIG. 2 includes a sensing thin film transistor ST and a sensing line VREF. The sensing thin film transistor ST is connected between a drain electrode of the driving thin film transistor DT and an anode electrode of the electroluminescent element OLED (hereinafter, a sensing node). The sensing thin film transistor ST operates to supply an initialization voltage (or sensing voltage) transmitted through the sensing line VREF to the sensing node, or operates to sense voltage or current of the sensing node.

The switching thin film transistor SW includes a source electrode connected to the first data line D1 and a drain electrode connected to a gate electrode of the driving thin film transistor DT. The driving thin film transistor DT includes a source electrode connected to the first power line EVDD and a drain electrode connected to the anode electrode of the electroluminescent element OLED.

The storage capacitor Cst includes a first electrode E1 connected to the anode electrode of the electroluminescent element OLED and a second electrode E2 connected to the gate electrode of the driving thin film transistor DT.

The electroluminescent element OLED includes an anode electrode connected to the drain electrode of the driving thin film transistor DT and a cathode electrode connected to the second power line EVSS.

The sensing thin film transistor ST includes a source electrode connected to the sensing line VREF and a drain electrode connected to the sensing node to which the anode electrode of the electroluminescent element OLED is connected.

The operating time of the sensing thin film transistor ST may be similar, identical, or different from that of the switching thin film transistor SW according to a compensation algorithm (or a configuration of the compensation circuit). For example, the sensing thin film transistor ST may have a gate electrode connected to a 1a scan line G1a, and the switching thin film transistor SW may have a gate electrode connected to a 1b scan line G1b. As another example, the 1a scan line G1a connected to the gate electrode of the sensing thin film transistor ST and the 1b scan line G1b connected to the gate electrode of the switching thin film transistor SW may be connected to share in common.

The sensing line VREF may be connected to the data driver. In this case, the data driver may sense the sensing node of a pixel and generate a sensing result during real time, a non-display period of an image, or an N frame period (here, N is an integer of 1 or more). Meanwhile, the switching thin film transistor SW and the sensing thin film transistor ST may be turned on at the same time. In this case, the sensing operation through the sensing line VREF and the data output operation for outputting the data signal are mutually separated (or divided) based on a time-sharing method of the data driver.

In addition, the compensation target according to the sensing result may be a digital data signal, an analog data signal, a gamma signal, or the like. The compensation circuit that generates a compensation signal (or compensation voltage) on the basis of the sensing result may be implemented on an inside of the data driver or an inside of the timing controller, or as a separate circuit.

Further, in the example of FIG. 3, although a pixel having 3T (Transistor) 1C (Capacitor) structure, including a switching thin film transistor SW, a driving thin film transistor DT, a storage capacitor Cst, an electroluminescent element OLED, and a sensing thin film transistor ST, has been described as an example, in the case where a compensation circuit CC is added, each sub-pixel may be composed of 3T2C, 4T2C, 5T1C, 6T2C, etc.

Hereinafter, the electroluminescent element of the electroluminescent display device according to the exemplary embodiment of the present disclosure will be described with reference to FIGS. 4 to 11.

Figure 4:
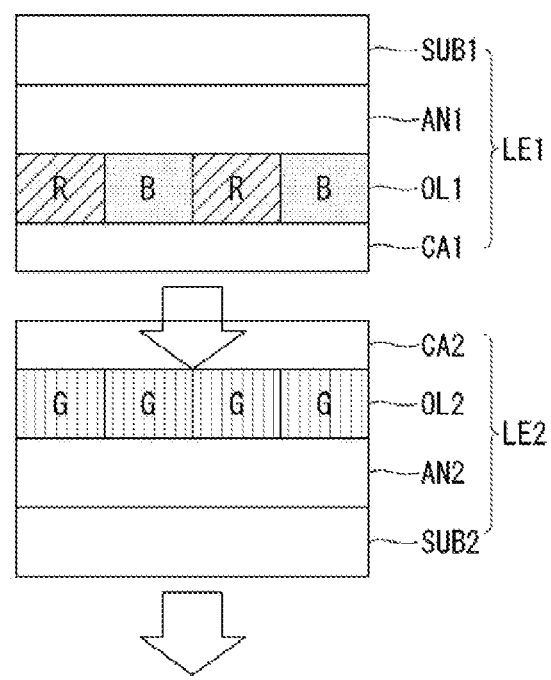
FIG. 4 is a cross-sectional view showing a first example of the electroluminescent element of the electroluminescent display device according to the exemplary embodiment of the present disclosure.

FIG. 4 is a cross-sectional view showing a first example of an electroluminescent element of an electroluminescent display device according to the exemplary embodiment of the present disclosure.

Referring to FIG. 4, the electroluminescent element of the first example according to the exemplary embodiment of the present disclosure includes a first light emitting element LE1 and a second light emitting element LE2.

The first light emitting element LE1 includes a first transparent substrate SUB1, a first anode electrode AN1 positioned on one surface of the first transparent substrate SUB1, a first light emitting layer OL1 provided with a first light emitter R and a second light emitter B disposed to be adjacent to each other on the first anode electrode AN1, and a first cathode electrode CA1 disposed on the first light emitting layer OL1. The first light emitter R emits red light, and the second light emitter B emits blue light.

The second light emitting element LE2 includes a second transparent substrate SUB2, a second anode electrode AN2 positioned on one surface of the second transparent substrate SUB2, a second light emitting layer OL2 including a third light emitter G disposed on the second anode electrode AN2, and a second cathode electrode CA2 disposed on the second light emitting layer OL2. The third light emitter G emits green light.

The first light emitting element LE1 and the second light emitting element LE2 are adhered by a transparent conductive adhesive (not shown) after the first cathode electrode CA1 and the second cathode electrode CA2 are disposed to face each other.

The first and second transparent substrates SUB1 and SUB2 may be flexible substrates or glass substrates, and the flexible substrates may be resin substrates such as flexible polyimide.

The first anode electrode AN1 may be formed of any one selected from a three-layer structure of Ni, Cr, Al, Ag, and ITO (indium tin oxide)/Ag/ITO, and a two-layer structure of Al/ITO. The first anode electrode AN1 functions as a reflective electrode.

The second anode electrode AN2 may be formed of any one selected from transparent conductive polymer materials such as Indium Tin Oxide (ITO), Indium Zinc Oxide (IZO), Carbon Nano-Tube (CNT), and PEDOT:PSS. The second anode electrode AN2 functions as a light-transmitting electrode.

The first light emitter R may include a first hole injection layer, a first hole transport layer, a first light emitting layer (for example, a red light emitting layer), and a first electron transport layer. The second light emitter B may include a second hole injection layer, a second hole transport layer, a second light emitting layer (for example, a blue light emitting layer), and a second electron transport layer. The third light emitter G may include a third hole injection layer, a third hole transport layer, a third light emitting layer (for example, a green light emitting layer), and a third electron transport layer.

The first cathode electrode CA1 and the second cathode electrode CA2 may be formed of any one selected from a two-layer structure of Ca/Ag, an alloy of Li:Al, and an alloy of Mg:Ag. The first and second cathode electrodes CA1 and CA2 function as semi-transparent electrodes that semi-transmit light. The thickness of the second cathode electrode CA2 is preferably formed thinner than the thickness of the first cathode electrode CA1 so as to reduce the loss of an amount of light emitted from the first light emitting layer OL1.

The transparent conductive adhesive (not shown) for adhering the first light emitting element LE1 and the second light emitting element LE2 may be formed of a transparent adhesive monomer, and a composition of a conductive polymer material or ITO Nano powder. The transparent adhesive monomer may be selected from any one of acrylic monomers, epoxy monomers, ether monomers, and combinations thereof. In addition, the conductive polymers may be selected from any one of polyacetylene, polypyrrole, polythiophene, poly (3-alkylthiophene), polyphenylene sulfide, polyparaphenylene sulfide, polyphenylene vinylene, polyparaphenylene vinylene, polythienylene vinylene, poly- phenylene, polyparaphenylene, polyazulene, polyfuran, polyaniline, polyselenophene, poltelurofen, and combinations thereof.

According to the electroluminescent element according to the first example of the present disclosure, after being incident the third light emitter G through the first and second cathode electrodes CA1 and CA2, the red light emitted from the first light emitter R and the blue light emitted from the second light emitter B, of the first light emitting element LE1, are emitted to the outside through the second anode electrode AN2 and the second transparent substrate SUB2. In the red light emitted from the first light emitter R and the blue light emitted from the second light emitter B, only red or blue light may be emitted, or light mixed with red and green or blue and green may be emitted, depending on whether the third light emitter G of the second light emitting element LE2 is operated. In addition, in the green light emitted from the third light emitter G, only green light may be emitted, or light mixed with green light and red light or light mixed with green light and blue light may be emitted, depending on whether the first light emitter R and the second light emitter B are operated. Therefore, since light emitted from the first light emitting element LE1 is combined with light emitted from the second light emitting element LE2 and emitted to the outside, an effect of obtaining light having high luminance and high resolution may be secured.

Figure 5:
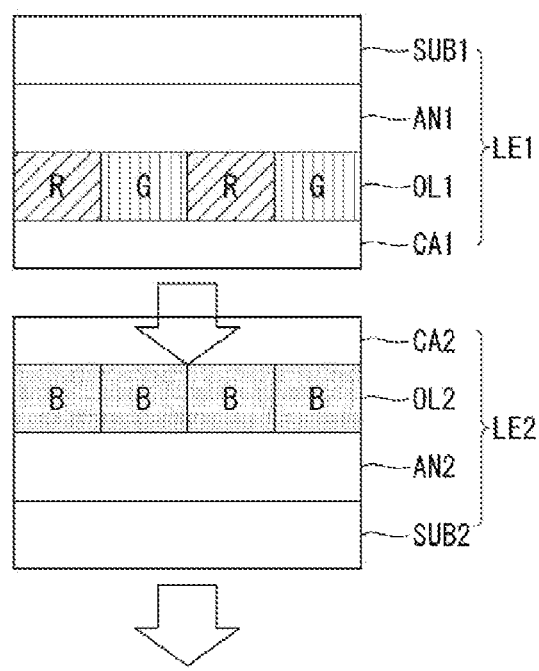
FIG. 5 is a cross-sectional view showing a second example of the electroluminescent element of the electroluminescent display device according to the exemplary embodiment of the present disclosure.

FIG. 5 is a cross-sectional view showing a second example of the electroluminescent element of the electroluminescent display device according to the exemplary embodiment of the present disclosure.

Referring to FIG. 5, the electroluminescent element of the second example according to the exemplary embodiment of the present disclosure includes a first light emitting element LE1 and a second light emitting device LE2.

The first light emitting element LE1 includes a first transparent substrate SUB1, a first anode electrode AN1 positioned on one surface of the first transparent substrate SUB1, a first light emitting layer OL1 provided with a first light emitter R and a second light emitter G disposed to be adjacent to each other on the first anode electrode AN1, and a first cathode electrode CA1 disposed on the first light emitting layer OL1. The first light emitter R emits red light, and the second light emitter G emits green light.

The second light emitting element LE2 includes a second transparent substrate SUB2, a second anode electrode AN2 positioned on one surface of the second transparent substrate SUB2, a second light emitting layer OL2 including a third light emitter B disposed on the second anode electrode AN2, and a second cathode electrode CA2 disposed on the second light emitting layer OL2. The third light emitter B emits blue light.

After being disposed such that the first cathode electrode CA1 and the second cathode electrode CA2 face each other, the first light emitting element LE1 and the second light emitting element LE2 are adhered by the transparent conductive adhesive (not shown).

The first and second transparent substrates SUB1 and SUB2 may be flexible substrates or glass substrates, and the flexible substrates may be resin substrates such as flexible polyimide.

The first anode electrode AN1 may be formed of any one selected from a three-layer structure of Ni, Cr, Al, Ag, and ITO (indium tin oxide)/Ag/ITO, and a two-layer structure of Al/ITO. The first anode electrode AN1 functions as a reflective electrode.

The second anode electrode AN2 may be formed of any one selected from transparent conductive polymer materials such as Indium Tin Oxide (ITO), Indium Zinc Oxide (IZO), Carbon Nano-Tube (CNT), and PEDOT:PSS. The second anode electrode AN2 functions as a light-transmitting electrode.

The first light emitter R may include a first hole injection layer, a first hole transport layer, a first light emitting layer (for example, a red light emitting layer), and a first electron transport layer. The second light emitter G may include a second hole injection layer, a second hole transport layer, a second light emitting layer (for example, a green light emitting layer), and a second electron transport layer. The third light emitter B may include a third hole injection layer, a third hole transport layer, a third light emitting layer (for example, a blue light emitting layer), and a third electron transport layer.

The first and second cathode electrodes CA1 and CA2 may be formed of any one selected from a two-layer structure of Ca/Ag, an alloy of Li:Al, and an alloy of Mg:Ag. The first and second cathode electrodes CA1 and CA2 function as semi-transparent electrodes that semi-transmit light. The thickness of the second cathode electrode CA2 is preferably formed thinner than the thickness of the first cathode electrode CA1 so as to reduce the loss of an amount of light emitted from the first light emitting layer OL1.

The transparent conductive adhesive (not shown) for adhering the first light emitting element LE1 and the second light emitting element LE2 may be formed of a transparent adhesive monomer and a composition of a conductive polymer material or ITO Nano powder. The transparent adhesive monomer may be selected from any one of acrylic monomers, epoxy monomers, ether monomers, and combinations thereof. In addition, the conductive polymers may be selected from any one of polyacetylene, polypyrrole, polythiophene, poly (3-alkylthiophene), polyphenylene sulfide, polyparaphenylene sulfide, polyphenylene vinylene, polyparaphenylene vinylene, polythienylene vinylene, polyphenylene, polyparaphenylene, polyazulene, polyfuran, polyaniline, polyselenophene, polytelurofen, and combinations thereof.

According to the electroluminescent element according to the second example of the present disclosure, after being incident the third light emitter B through the first and second cathode electrodes CA1 and CA2, the red light emitted from the first light emitter R of the first light emitting element LE1 and the green light emitted from the second light emitter G are emitted to the outside through the second anode electrode AN2 and the second transparent substrate SUB2. In the red light emitted from the first light emitter R and the green light emitted from the second light emitter G, only red or green light may be emitted, or light mixed with red and blue or green and blue may be emitted, depending on whether the third light emitter B of the second light emitting element LE2 is operated. In addition, in the blue light emitted from the third light emitter B, only blue light may be emitted, or light mixed with blue light and red light or light mixed with blue light and green light may be emitted, depending on whether the first light emitter R and the second light emitter G are operated. Therefore, since light emitted from the first light emitting element LE1 is combined with light emitted from the second light emitting element LE2 and emitted to the outside, an effect of obtaining light having high luminance and high resolution may be secured.

Figure 6:
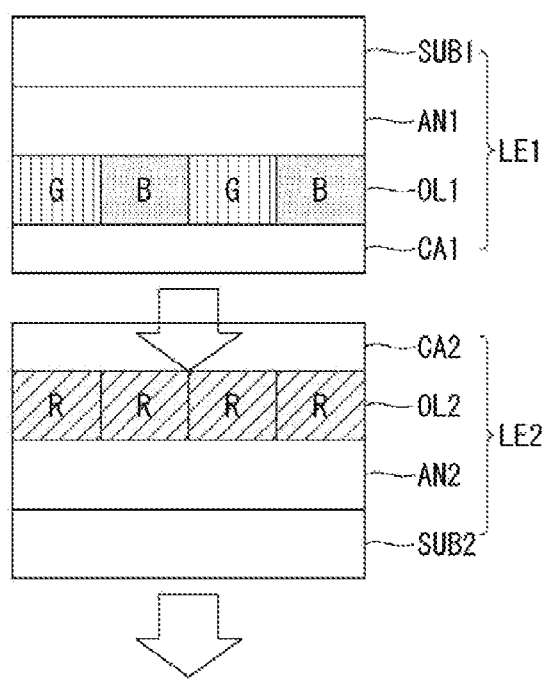
FIG. 6 is a cross-sectional view showing a third example of the electroluminescent element of the electroluminescent display device according to the exemplary embodiment of the present disclosure.

FIG. 6 is a cross-sectional view showing a third example of the electroluminescent element of the electroluminescent display device according to the exemplary embodiment of the present disclosure.

Referring to FIG. 6, the electroluminescent element of the third example according to the exemplary embodiment of the present disclosure includes a first light emitting element LE1 and a second light emitting device LE2.

The first light emitting element LE1 includes a first transparent substrate SUB1, a first anode electrode AN1 positioned on one surface of the first transparent substrate SUB1, a first light emitting layer OL1 provided with a first light emitter G and a second light emitter B disposed to be adjacent to each other on the first anode electrode AN1, and a first cathode electrode CA1 disposed on the first light emitting layer OL1. The first light emitter G emits green light, and the second light emitter B emits blue light.

The second light emitting element LE2 includes a second transparent substrate SUB2, a second anode electrode AN2 positioned on one surface of the second transparent substrate SUB2, a second light emitting layer OL2 including a third light emitter R disposed on the second anode electrode AN2, and a second cathode electrode CA2 disposed on the second light emitting layer OL2. The third light emitter R emits red light.

After being disposed such that the first cathode electrode CA1 and the second cathode electrode CA2 face each other, the first light emitting element LE1 and the second light emitting element LE2 are adhered by the transparent conductive adhesive (not shown).

The first and second transparent substrates SUB1 and SUB2 may be flexible substrates or glass substrates, and the flexible substrates may be resin substrates such as flexible polyimide.

The first anode electrode AN1 may be formed of any one selected from a three-layer structure of Ni, Cr, Al, Ag, and ITO (indium tin oxide)/Ag/ITO, and a two-layer structure of Al/ITO. The first anode electrode AN1 functions as a reflective electrode.

The second anode electrode AN2 may be formed of any one selected from transparent conductive polymer materials such as Indium Tin Oxide (ITO), Indium Zinc Oxide (IZO), Carbon Nano-Tube (CNT), and PEDOT:PSS. The second anode electrode AN2 functions as a light-transmitting electrode.

The first light emitter G may include a first hole injection layer, a first hole transport layer, a first light emitting layer (for example, a green light emitting layer), and a first electron transport layer. The second light emitter B may include a second hole injection layer, a second hole transport layer, a second light emitting layer (for example, a blue light emitting layer), and a second electron transport layer. The third light emitter R may include a third hole injection layer, a third hole transport layer, a third light emitting layer (for example, a red light emitting layer), and a third electron transport layer.

The first and second cathode electrodes CA1 and CA2 may be formed of any one selected from a two-layer structure of Ca/Ag, an alloy of Li:Al, and an alloy of Mg:Ag. The first and second cathode electrodes CA1 and CA2 function as semi-transparent electrodes that semi-transmit light. The thickness of the second cathode electrode CA2 is preferably formed thinner than the thickness of the first cathode electrode CA1 so as to reduce the loss of an amount of light emitted from the first light emitting layer OL1.

The transparent conductive adhesive (not shown) for adhering the first light emitting element LE1 and the second light emitting element LE2 may be formed of a transparent adhesive monomer and a composition of a conductive polymer material or ITO Nano powder. The transparent adhesive monomer may be selected from any one of acrylic monomers, epoxy monomers, ether monomers, and combinations thereof. In addition, the conductive polymers may be selected from any one of polyacetylene, polypyrrole, polythiophene, poly (3-alkylthiophene), polyphenylene sulfide, polyparaphenylene sulfide, polyphenylene vinylene, polyparaphenylene vinylene, polythienylene vinylene, polyphenylene, polyparaphenylene, polyazulene, polyfuran, polyaniline, polyselenophene, polytelurofen, and combinations thereof.

According to the electroluminescent element according to the third example of the present disclosure, after being incident the third light emitter R through the first and second cathode electrodes CA1 and CA2, the green light emitted from the first light emitter G of the first light emitting element LE1 and the blue light emitted from the second light emitter B are emitted to the outside through the second anode electrode AN2 and the second transparent substrate SUB2. In the green light emitted from the first light emitter G and the blue light emitted from the second light emitter B, only green or blue light may be emitted, or light mixed with green and red or blue and red may be emitted, depending on whether the third light emitter R of the second light emitting element LE2 is operated. In addition, in the red light emitted from the third light emitter R, only red light may be emitted, or light mixed with green light and red light or light mixed with blue light and red light may be emitted, depending on whether the first light emitter G and the second light emitter B are operated. Therefore, since light emitted from the first light emitting element LE1 is combined with light emitted from the second light emitting element LE2 and emitted to the outside, an effect of obtaining light having high luminance and high resolution may be secured.

Figure 7:
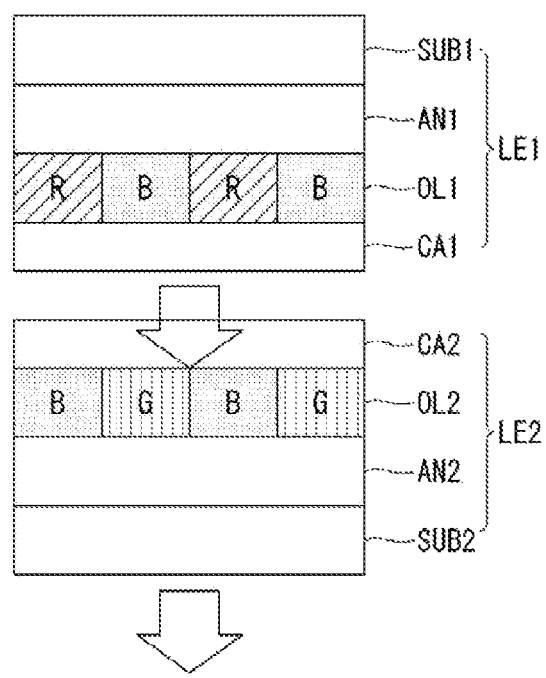
FIG. 7 is a cross-sectional view showing a fourth example of the electroluminescent element of the electroluminescent display device according to the exemplary embodiment of the present disclosure.

FIG. 7 is a cross-sectional view showing a fourth example of the electroluminescent element of the electroluminescent display device according to the exemplary embodiment of the present disclosure.

Referring to FIG. 7, the electroluminescent element of the fourth example according to the exemplary embodiment of the present disclosure includes a first light emitting element LE1 and a second light emitting device LE2.

The first light emitting element LE1 includes a first transparent substrate SUB1, a first anode electrode AN1 positioned on one surface of the first transparent substrate SUB1, a first light emitting layer OL1 provided with a first light emitter R and a second light emitter B disposed to be adjacent to each other on the first anode electrode AN1, and a first cathode electrode CA1 disposed on the first light emitting layer OL1. The first light emitter R emits red light, and the second light emitter B emits blue light.

The second light emitting element LE2 includes a second transparent substrate SUB2, a second anode electrode AN2 positioned on one surface of the second transparent substrate SUB2, a second light emitting layer OL2 including a third light emitter B and a fourth light emitter G, which are disposed on the second anode electrode AN2 to face each other, and a second cathode electrode CA2 disposed on the second light emitting layer OL2. The third light emitter B is disposed to overlap the first light emitter R, and the fourth light emitter G is disposed to overlap the second light emitter B. The third light emitter B emits blue light, and the fourth light emitter G emits green light. After being disposed such that the first cathode electrode CA1 and the second cathode electrode CA2 face each other, the first light emitting element LE1 and the second light emitting element LE2 are adhered by the transparent conductive adhesive (not shown).

The first and second transparent substrates SUB1 and SUB2 may be flexible substrates or glass substrates, and the flexible substrates may be resin substrates such as flexible polyimide.

The first anode electrode AN1 may be formed of any one selected from a three-layer structure of Ni, Cr, Al, Ag, and ITO (indium tin oxide)/Ag/ITO, and a two-layer structure of Al/ITO. The first anode electrode AN1 functions as a reflective electrode.

The second anode electrode AN2 may be formed of any one selected from transparent conductive polymer materials such as Indium Tin Oxide (ITO), Indium Zinc Oxide (IZO), Carbon Nano-Tube (CNT), and PEDOT:PSS. The second anode electrode AN2 functions as a light-transmitting electrode.

The first light emitter R may include a first hole injection layer, a first hole transport layer, a first light emitting layer (for example, a red light emitting layer), and a first electron transport layer. The second light emitter B may include a second hole injection layer, a second hole transport layer, a second light emitting layer (for example, a blue light emitting layer), and a second electron transport layer. The third light emitter B may include a third hole injection layer, a third hole transport layer, a third light emitting layer (for example, a blue light emitting layer), and a third electron transport layer. The fourth light emitter G may include a fourth hole injection layer, a fourth hole transport layer, a fourth light emitting layer (for example, a green light emitting layer), and a fourth electron transport layer.

The first and second cathode electrodes CA1 and CA2 may be formed of any one selected from a two-layer structure of Ca/Ag, an alloy of Li:Al, and an alloy of Mg:Ag. The first and second cathode electrodes CA1 and CA2 function as semi-transparent electrodes that semi-transmit light. The thickness of the second cathode electrode CA2 is preferably formed thinner than the thickness of the first cathode electrode CA1 so as to reduce the loss of an amount of light emitted from the first light emitting layer OL1.

The transparent conductive adhesive (not shown) for adhering the first light emitting element LE1 and the second light emitting element LE2 may be formed of a transparent adhesive monomer and a composition of a conductive polymer material or ITO Nano powder. The transparent adhesive monomer may be selected from any one of acrylic monomers, epoxy monomers, ether monomers, and combinations thereof. In addition, the conductive polymers may be selected from any one of polyacetylene, polypyrrole, polythiophene, poly (3-alkylthiophene), polyphenylene sulfide, polyparaphenylene sulfide, polyphenylene vinylene, polyparaphenylene vinylene, polythienylene vinylene, polyphenylene, polyparaphenylene, polyazulene, polyfuran, polyaniline, polyselenophene, polytelurofen, and combinations thereof.

According to the electroluminescent element according to the fourth example of the present disclosure, after being incident on the third light emitter B through the first and second cathode electrodes CA1 and CA2, the red light emitted from the first light emitter R of the first light emitting element LE1 is emitted to the outside through the second anode electrode AN2 and the second transparent substrate SUB2. The blue light emitted from the third light emitter B is emitted to the outside through the second anode electrode AN2 and the second transparent substrate SUB2. In the red light emitted from the first light emitter R and the blue light emitted from the third light emitter B, red light, blue light, or light mixed with red light and blue light may be emitted, depending on whether the first light emitter R and the third light emitter B are operated.

Further, after being incident on the fourth light emitter G through the first and second cathode electrodes CA1 and CA2, the blue light emitted from the second light emitter B of the first light emitting element LE1 is emitted to the outside through the second anode electrode AN2 and the second transparent substrate SUB2. The green light emitted from the fourth light emitter G is emitted to the outside through the second anode electrode AN2 and the second transparent substrate SUB2. In the blue light emitted from the second light emitter B and the green light emitted from the fourth light emitter G, blue light, green light, or mixed light with blue light and green light may be emitted, depending on whether the second light emitter B and the fourth light emitter G are operated.

Therefore, since light emitted from the first light emitting element LE1 is combined with light emitted from the second light emitting element LE2 and emitted to the outside, an effect of obtaining light having high luminance and high resolution may be secured.

Figure 8:
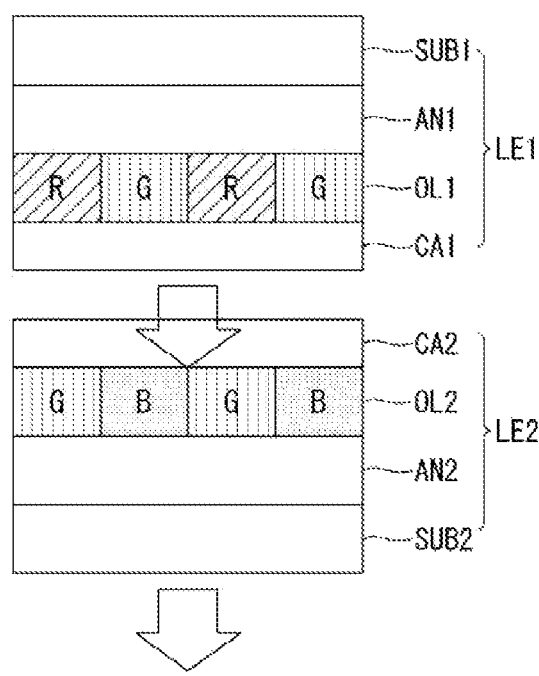
FIG. 8 is a cross-sectional view showing a fifth example of the electroluminescent element of the electroluminescent display device according to the exemplary embodiment of the present disclosure.

FIG. 8 is a cross-sectional view showing a fifth example of the electroluminescent element of the electroluminescent display device according to the exemplary embodiment of the present disclosure.

Referring to FIG. 8, the electroluminescent element of the fifth example according to the exemplary embodiment of the present disclosure includes a first light emitting element LE1 and a second light emitting element LE2.

The first light emitting element LE1 includes a first transparent substrate SUB1, a first anode electrode AN1 positioned on one surface of the first transparent substrate SUB1, a first light emitting layer OL1 provided with a first light emitter R and a second light emitter G disposed to be adjacent to each other on the first anode electrode AN1, and a first cathode electrode CA1 disposed on the first light emitting layer OL1. The first light emitter R emits red light, and the second light emitter G emits green light.

The second light emitting element LE2 includes a second transparent substrate SUB2, a second anode electrode AN2 positioned on one surface of the second transparent substrate SUB2, a second light emitting layer OL2 including a third light emitter G and a fourth light emitter B disposed to be adjacent to each other on the second anode electrode AN2, and a second cathode electrode CA2 disposed on the second light emitting layer OL2. The third light emitter G is disposed to overlap the first light emitter R, and the fourth light emitter B is disposed to overlap the second light emitter G. The third light emitter G emits green light, and the fourth light emitter B emits blue light. After being disposed such that the first cathode electrode CA1 and the second cathode electrode CA2 face each other, the first light emitting element LE1 and the second light emitting element LE2 are adhered by the transparent conductive adhesive (not shown).

The first and second transparent substrates SUB1 and SUB2 may be flexible substrates or glass substrates, and the flexible substrates may be resin substrates such as flexible polyimide.

The first anode electrode AN1 may be formed of any one selected from a three-layer structure of Ni, Cr, Al, Ag, and ITO (indium tin oxide)/Ag/ITO, and a two-layer structure of Al/ITO. The first anode electrode AN1 functions as a reflective electrode.

The second anode electrode AN2 may be formed of any one selected from transparent conductive polymer materials such as Indium Tin Oxide (ITO), Indium Zinc Oxide (IZO), Carbon Nano-Tube (CNT), and PEDOT:PSS. The second anode electrode AN2 functions as a light-transmitting electrode.

The first light emitter R may include a first hole injection layer, a first hole transport layer, a first light emitting layer (for example, a red light emitting layer), and a first electron transport layer. The second light emitter G may include a second hole injection layer, a second hole transport layer, a second light emitting layer (for example, a green light emitting layer), and a second electron transport layer. The third light emitter G may include a third hole injection layer, a third hole transport layer, a third light emitting layer (for example, a green light emitting layer), and a third electron transport layer. The fourth light emitter B may include a fourth hole injection layer, a fourth hole transport layer, a fourth light emitting layer (for example, a blue light emitting layer), and a fourth electron transport layer.

The first and second cathode electrodes CA1 and CA2 may be formed of any one selected from a two-layer structure of Ca/Ag, an alloy of Li:Al, and an alloy of Mg:Ag. The first and second cathode electrodes CA1 and CA2 function as semi-transparent electrodes that semi-transmit light. The thickness of the second cathode electrode CA2 is preferably formed thinner than the thickness of the first cathode electrode CA1 so as to reduce the loss of an amount of light emitted from the first light emitting layer OL1.

The transparent conductive adhesive (not shown) for adhering the first light emitting element LE1 and the second light emitting element LE2 may be formed of a transparent adhesive monomer and a composition of a conductive polymer material or ITO Nano powder. The transparent adhesive monomer may be selected from any one of acrylic monomers, epoxy monomers, ether monomers, and combinations thereof. In addition, the conductive polymers may be selected from any one of polyacetylene, polypyrrole, polythiophene, poly (3-alkylthiophene), polyphenylene sulfide, polyparaphenylene sulfide, polyphenylene vinylene, polyparaphenylene vinylene, polythienylene vinylene, polyphenylene, polyparaphenylene, polyazulene, polyfuran, polyaniline, polyselenophene, polytelurofen, and combinations thereof.

According to the electroluminescent element according to the fifth example of the present disclosure, after being incident on the third light emitter G through the first and second cathode electrodes CA1 and CA2, the red light emitted from the first light emitter R of the first light emitting element LE1 is emitted to the outside through the second anode electrode AN2 and the second transparent substrate SUB2. The green light emitted from the third light emitter G is emitted to the outside through the second anode electrode AN2 and the second transparent substrate SUB2. In the red light emitted from the first light emitter R and the green light emitted from the third light emitter G, red light, green light, or light mixed with red light and green light may be emitted, depending on whether the first light emitter R and the third light emitter G operate.

In addition, after being incident on the fourth light emitter B through the first and second cathode electrodes CA1 and CA2, the green light emitted from the second light emitter G of the second light emitting element LE1 is emitted to the outside through the second anode electrode AN2 and the second transparent substrate SUB2. The blue light emitted from the fourth light emitter B is emitted to the outside through the second anode electrode AN2 and the second transparent substrate SUB2. In the green light emitted from the second light emitter G and the blue light emitted from the fourth light emitter B, green light, blue light, or light mixed with green light and blue light may be emitted, depending on whether the second light emitter G and the fourth light emitter B are operated.

Therefore, since light emitted from the first light emitting element LE1 is combined with light emitted from the second light emitting element LE2 and emitted to the outside, an effect of obtaining light having high luminance and high resolution may be secured.

Figure 9:
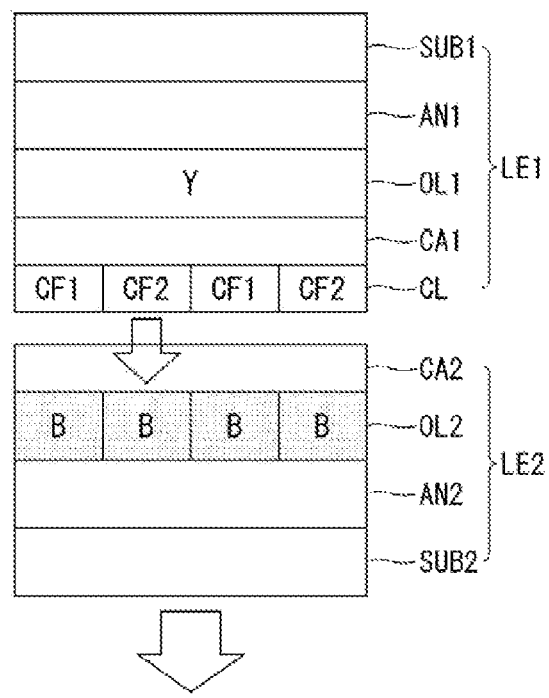
FIG. 9 is a cross-sectional view showing a sixth example of the electroluminescent element of the electroluminescent display device according to the exemplary embodiment of the present disclosure.

FIG. 9 is a cross-sectional view showing a sixth example of the electroluminescent element of the electroluminescent display device according to the exemplary embodiment of the present disclosure.

Referring to FIG. 9, the electroluminescent element of the sixth example according to the exemplary embodiment of the present disclosure includes a first light emitting element LE1 and a second light emitting element LE2.

The first light emitting element LE1 includes a first transparent substrate SUB1, a first anode electrode AN1 positioned on one surface of the first transparent substrate SUB1, the first light emitting layer OL1 including a first light emitter Y disposed on the first anode electrode AN1, a first cathode electrode CA1 disposed on the first light emitting layer OL1, and a color filter layer CL provided with a first color filter CF1 and a second color filter CF2 disposed to be adjacent to each other on the first cathode electrode CA1. The first light emitter Y emits yellow light. The first color filter CF1 is a red color filter displaying red color, and the second color filter CF2 is a green color filter displaying green color.

The second light emitting element LE2 includes a second transparent substrate SUB2, a second anode electrode AN2 positioned on one surface of the second transparent substrate SUB2, a second light emitting layer OL2 including a second light emitter B disposed on the second anode electrode AN2, and a second cathode electrode CA2 disposed on the second light emitting layer OL2. The second light emitter B emits blue light.

After the color filter layer CL and the second cathode electrode CA2 are disposed to face each other, the first light emitting element LE1 and the second light emitting element LE2 are adhered by the transparent conductive adhesive (not shown).

The first and second transparent substrates SUB1 and SUB2 may be flexible substrates or glass substrates, and the flexible substrates may be resin substrates such as flexible polyimide.

The first anode electrode AN1 may be formed of any one selected from a three-layer structure of Ni, Cr, Al, Ag, and ITO (indium tin oxide)/Ag/ITO, and a two-layer structure of Al/ITO. The first anode electrode AN1 functions as a reflective electrode.

The second anode electrode AN2 may be formed of any one selected from transparent conductive polymer materials such as Indium Tin Oxide (ITO), Indium Zinc Oxide (IZO), Carbon Nano-Tube (CNT), and PEDOT:PSS. The second anode electrode AN2 functions as a light-transmitting electrode.

The first light emitter Y may include a first hole injection layer, a first hole transport layer, a first light emitting layer (for example, a yellow light emitting layer), and a first electron transport layer. The second light emitter B may include a second hole injection layer, a second hole transport layer, a second light emitting layer (for example, a blue light emitting layer), and a second electron transport layer.

The first and second cathode electrodes CA1 and CA2 may be formed of any one selected from a two-layer structure of Ca/Ag, an alloy of Li:Al, and an alloy of Mg:Ag.

The first and second cathode electrodes CA1 and CA2 function as semi-transparent electrodes that semi-transmit light. The thickness of the second cathode electrode CA2 is preferably formed thinner than the thickness of the first cathode electrode CA1 so as to reduce the loss of an amount of light emitted from the first light emitting layer OL1.

The transparent conductive adhesive (not shown) for adhering the first light emitting element LE1 and the second light emitting element LE2 may be formed of a transparent adhesive monomer and a composition of a conductive polymer material or ITO Nano powder. The transparent adhesive monomer may be selected from any one of acrylic monomers, epoxy monomers, ether monomers, and combinations thereof. In addition, the conductive polymers may be selected from any one of polyacetylene, polypyrrole, polythiophene, poly (3-alkylthiophene), polyphenylene sulfide, polyparaphenylene sulfide, polyphenylene vinylene, polyparaphenylene vinylene, polythienylene vinylene, polyphenylene, polyparaphenylene, polyazulene, polyfuran, polyaniline, polyselenophene, polytelurofen, and combinations thereof.

According to the electroluminescent element according to the sixth example of the present disclosure, after being incident on the second light emitter B through the second cathode electrode CA2 after passing through the first color filter (i.e., red color filter), the yellow light emitted from the first light emitter Y of the first light emitting element LE1 is emitted to the outside through the second anode electrode AN2 and the second transparent substrate SUB2. The yellow light emitted from the first light emitter Y is converted into red light after passing through the first color filter CF1, and then converted into green light after passing through the second color filter CF2, so that only red light, green light, or blue light may be emitted, or light mixed with red and blue, or light mixed with green and blue may be emitted, depending on whether the first light emitter Y and the second light emitter B are operated. Therefore, since light emitted from the first light emitting element LE1 is combined with light emitted from the second light emitting element LE2 and emitted to the outside, an effect of obtaining light having high luminance and high resolution may be secured.

Figure 10:
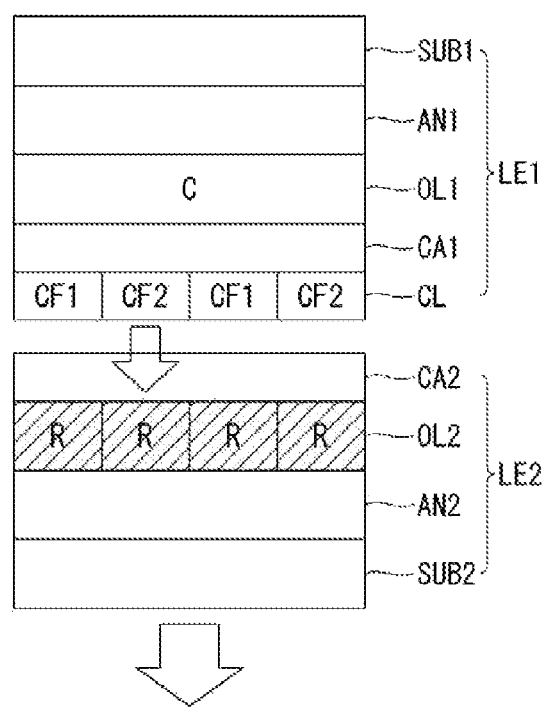
FIG. 10 is a cross-sectional view showing a seventh example of the electroluminescent element of the electroluminescent display device according to the exemplary embodiment of the present disclosure.

FIG. 10 is a cross-sectional view showing a seventh example of the electroluminescent element of the electroluminescent display device according to the exemplary embodiment of the present disclosure.

Referring to FIG. 10, the electroluminescent element of the seventh example according to the exemplary embodiment of the present disclosure includes a first light emitting element LE1 and a second light emitting element LE2.

The first light emitting element LE1 includes a first transparent substrate SUB1, a first anode electrode AN1 positioned on one surface of the first transparent substrate SUB1, a first light emitting layer OL1 including a first light emitter C disposed on the first anode electrode AN1, a first cathode electrode CA1 disposed on the first light emitting layer OL1, and a color filter layer CL provided with a first color filter CF1 and a second color filter CF2 disposed to be adjacent to each other on the first cathode electrode CA1. The first light emitter C emits cyan light. The first color filter CF1 is a blue color filter displaying blue color, and the second color filter CF2 is a green color filter displaying green color.

The second light emitting element LE2 includes a second transparent substrate SUB2, a second anode electrode AN2 positioned on one surface of the second transparent substrate SUB2, a second light emitting layer OL2 including a second light emitter R disposed on the second anode electrode AN2, and a second cathode electrode CA2 disposed on the second light emitting layer OL2. The second light emitter R emits red light.

After the color filter layer CL and the second cathode electrode CA2 are disposed to face each other, the first light emitting element LE1 and the second light emitting element LE2 are adhered by the transparent conductive adhesive (not shown).

The first and second transparent substrates SUB1 and SUB2 may be flexible substrates or glass substrates, and the flexible substrates may be resin substrates such as flexible polyimide.

The first anode electrode AN1 may be formed of any one selected from a three-layer structure of Ni, Cr, Al, Ag, and ITO (indium tin oxide)/Ag/ITO, and a two-layer structure of Al/ITO. The first anode electrode AN1 functions as a reflective electrode.

The second anode electrode AN2 may be formed of any one selected from transparent conductive polymer materials such as Indium Tin Oxide (ITO), Indium Zinc Oxide (IZO), Carbon Nano-Tube (CNT), and PEDOT:PSS. The second anode electrode AN2 functions as a light-transmitting electrode.

The first light emitter C may include a first hole injection layer, a first hole transport layer, a first light emitting layer (for example, a cyan light emitting layer), and a first electron transport layer. The second light emitter R may include a second hole injection layer, a second hole transport layer, a second light emitting layer (for example, a red light emitting layer), and a second electron transport layer.

The first and second cathode electrodes CA1 and CA2 may be formed of any one selected from a two-layer structure of Ca/Ag, an alloy of Li:Al, and an alloy of Mg:Ag. The first and second cathode electrodes CA1 and CA2 function as semi-transparent electrodes that semi-transmit light. The thickness of the second cathode electrode CA2 is preferably formed thinner than the thickness of the first cathode electrode CA1 so as to reduce the loss of an amount of light emitted from the first light emitting layer OL1.

The transparent conductive adhesive (not shown) for adhering the first light emitting element LE1 and the second light emitting element LE2 may be formed of a transparent adhesive monomer and a composition of a conductive polymer material or ITO Nano powder. The transparent adhesive monomer may be selected from any one of acrylic monomers, epoxy monomers, ether monomers, and combinations thereof. In addition, the conductive polymers may be selected from any one of polyacetylene, polypyrrole, polythiophene, poly (3-alkylthiophene), polyphenylene sulfide, polyparaphenylene sulfide, polyphenylene vinylene, polyparaphenylene vinylene, polythienylene vinylene, polyphenylene, polyparaphenylene, polyazulene, polyfuran, polyaniline, polyselenophene, polytelurofen, and combinations thereof.

According to the electroluminescent element according to the seventh example of the present disclosure, after being incident on the second light emitter R through the second cathode electrode CA2 after passing through the first color filter (i.e., blue color filter), the cyan light emitted from the first light emitter C of the first light emitting element LE1 is emitted to the outside through the second anode electrode AN2 and the second transparent substrate SUB2. The cyan light emitted from the first light emitter C is converted into blue light after passing through the first color filter CF1, and then converted into green light after passing through the second color filter CF2, so that only blue light, green light, or red light are emitted, or light mixed with blue and red light, or light mixed with green and red light may be emitted, depending on whether the first light emitter C and the second light emitter R are operated. Therefore, since light emitted from the first light emitting element LE1 is combined with light emitted from the second light emitting element LE2 and emitted to the outside, an effect of obtaining light having high luminance and high resolution may be secured.

Figure 11:
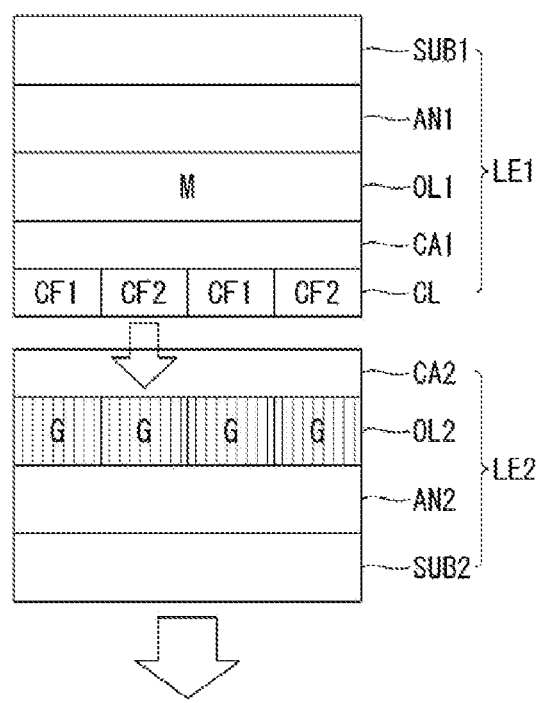
FIG. 11 is a cross-sectional view showing an eighth example of the electroluminescent element of the electroluminescent display device according to the exemplary embodiment of the present disclosure.

FIG. 11 is a cross-sectional view showing an eighth example of the electroluminescent element of the electroluminescent display device according to the exemplary embodiment of the present disclosure.

Referring to FIG. 11, the electroluminescent element of the eighth example according to the exemplary embodiment of the present disclosure includes a first light emitting element LE1 and a second light emitting element LE2.

The first light emitting element LE1 includes a first transparent substrate SUB1, a first anode electrode AN1 positioned on one surface of the first transparent substrate SUB1, a first light emitting layer OL1 including a first light emitter M disposed on the first anode electrode AN1, a first cathode electrode CA1 disposed on the first light emitting layer OL1, and a color filter layer CL provided with a first color filter CF1 and a second color filter CF2 disposed to be adjacent to each other on the first cathode electrode CA1. The first light emitter M emits a magenta color. The first color filter CF1 is a red color filter displaying red color, and the second color filter CF2 is a blue color filter displaying blue color.

The second light emitting element LE2 includes a second transparent substrate SUB2, a second anode electrode AN2 positioned on one surface of the second transparent substrate SUB2, a second light emitting layer OL2 including a second light emitter G disposed on the second anode electrode AN2, and a second cathode electrode CA2 disposed on the second light emitting layer OL2. The second light emitter G emits green light.

After the color filter layer CL and the second cathode electrode CA2 are disposed to face each other, the first light emitting element LE1 and the second light emitting element LE2 are adhered by the transparent conductive adhesive (not shown).

The first and second transparent substrates SUB1 and SUB2 may be flexible substrates or glass substrates, and the flexible substrates may be resin substrates such as flexible polyimide.

The first anode electrode AN1 may be formed of any one selected from a three-layer structure of Ni, Cr, Al, Ag, and ITO (indium tin oxide)/Ag/ITO, and a two-layer structure of Al/ITO. The first anode electrode AN1 functions as a reflective electrode.

The second anode electrode AN2 may be formed of any one selected from transparent conductive polymer materials such as Indium Tin Oxide (ITO), Indium Zinc Oxide (IZO), Carbon Nano-Tube (CNT), and PEDOT:PSS. The second anode electrode AN2 functions as a light-transmitting electrode.

The first light emitter M may include a first hole injection layer, a first hole transport layer, a first light emitting layer (for example, a magenta light emitting layer), and a first electron transport layer. The second light emitter G may include a second hole injection layer, a second hole transport layer, a second light emitting layer (for example, a green light emitting layer), and a second electron transport layer.

The first and second cathode electrodes CA1 and CA2 may be formed of any one selected from a two-layer structure of Ca/Ag, an alloy of Li:Al, and an alloy of Mg:Ag. The first and second cathode electrodes CA1 and CA2 function as semi-transparent electrodes that semi-transmit light. The thickness of the second cathode electrode CA2 is preferably formed thinner than the thickness of the first cathode electrode CA1 so as to reduce the loss of an amount of light emitted from the first light emitting layer OL1.

The transparent conductive adhesive (not shown) for adhering the first light emitting element LE1 and the second light emitting element LE2 may be formed of a transparent adhesive monomer and a composition of a conductive polymer material or ITO Nano powder. The transparent adhesive monomer may be selected from any one of acrylic monomers, epoxy monomers, ether monomers, and combinations thereof. In addition, the conductive polymers may be selected from any one of polyacetylene, polypyrrole, polythiophene, poly (3-alkylthiophene), polyphenylene sulfide, polyparaphenylene sulfide, polyphenylene vinylene, polyparaphenylene vinylene, polythienylene vinylene, polyphenylene, polyparaphenylene, polyazulene, polyfuran, polyaniline, polyselenophene, polytelurofen, and combinations thereof.

According to the electroluminescent element according to the eighth example of the present disclosure, after being incident on the second light emitter G through the second cathode electrode CA2 after passing through the first and second cathode electrodes CA1 and CA2, the magenta light emitted from the first light emitter M of the first light emitting element LE1 is emitted to the outside through the second anode electrode AN2 and the second transparent substrate SUB2. The magenta light emitted from the first light emitter M is converted into red light after passing through the first color filter CF1, and then converted into blue light after passing through the second color filter CF2, so that only red light, blue light, or green light may be emitted, or light mixed with red and green, or light mixed with blue and green may be emitted, depending on whether the first light emitter M and the second light emitter G are operated. Therefore, since light emitted from the first light emitting element LE1 is combined with light emitted from the second light emitting element LE2 and emitted to the outside, an effect of obtaining light having high luminance and high resolution may be secured.

According to the electroluminescent element according to the first to eighth examples of the present disclosure described in detail, by overlapping and disposing a first light emitting element and a second light emitting element, the light emitted from the first light emitting element is combined with the light emitted from the second light emitting element and emitted to the outside, and thus there is an effect of obtaining light having high luminance and high resolution. In addition, a single pixel is made to have the light of a first color emitted from the first light emitting element and the light of a second color emitted from the second light emitting element and different from the first color, whereby, there is an effect where the light having high luminance and high resolution may be obtained.

The electroluminescent element and the electroluminescent display device according to the present disclosure may be described as follows.

An electroluminescent element according to an exemplary embodiment of the present disclosure includes: a first light emitting element provided with a first light emitter emitting light of a first color and a second light emitter emitting light of a second color different from the first color, the first light emitter and the second light emitter being disposed to be adjacent to each other; and a second light emitting element provided with a third light emitter disposed to overlap the first light emitter and the second light emitter and emitting light of a third color different from the first and second colors, wherein light of the first and second colors emitted from the first light emitting element is emitted through the second light emitting element.

In the exemplary embodiment, the first light emitting element may include a first electrode disposed on a first surface of the first and second light emitters, and a second electrode disposed on a second surface opposite to the first surface of the first and second light emitters so as to face the first electrode; the second light emitting element may include a third electrode disposed on a first surface of the third light emitter, and a fourth electrode disposed on a second surface opposite to the first surface of the third light emitter so as to face the third electrode; and the second electrode and the third electrode may be adhered to each other.

In addition, in the exemplary embodiment, the first electrode may be a first anode electrode that reflects light from the first and second light emitters, the second electrode may be a first cathode electrode that transmits a part of each light emitted from the first and second light emitters, the third electrode may be a second cathode electrode that transmits a part of light emitted from the first cathode electrode, and the fourth electrode may be a second anode electrode that transmits light emitted from the third light emitter.

In addition, the first light emitter may emit red light, the second light emitter may emit blue light, and the third light emitter may emit green light.

In addition, the first light emitter may emit red light, the second light emitter may emit green light, and the third light emitter may emit blue light.

In addition, the first light emitter may emit red light, the second light emitter may emit blue light, and the third light emitter may emit green light.

An electroluminescent element according to another exemplary embodiment of the present disclosure includes: a first light emitting element provided with a first light emitter emitting light of a first color, and a second light emitter emitting light of a second color different from the first color, the first light emitter and the second light emitter being disposed to be adjacent to each other; and a second light emitting element provided with a third light emitter disposed to overlap the first light emitter and emitting light of the second color, and a fourth light emitter disposed to overlap the second light emitter and emitting light of a third color, the third light emitter and the fourth light emitter being disposed to be adjacent to each other, wherein light emitted from the first light emitting element is emitted through the second light emitting element.

In the exemplary embodiment, the first light emitting element may include a first electrode disposed on a first surface of the first and second light emitters, and a second electrode disposed on a second surface opposite to the first surface of the first and second light emitters so as to face the first electrode; the second light emitting element may include a third electrode disposed on a first surface of the third and fourth light emitters, and a fourth electrode disposed on a second surface opposite to the first surface of the third and fourth light emitters so as to face the third electrode; and the second electrode and the third electrode may be adhered to each other.

In addition, the first electrode may be a first anode electrode that reflects light from the first and second light emitters, the second electrode may be a first cathode electrode that transmits a part of each light emitted from the first and second light emitters, the third electrode may be a second cathode electrode that transmits a part of light emitted from the first cathode electrode, and the fourth electrode may be a second anode electrode that transmits light emitted from the third light emitter.

In addition, the first light emitter may emit red light, the second light emitter may emit blue light, the third light emitter may emit blue light, and the fourth light emitter may emit green light.

In addition, the first light emitter may emit red light, the second light emitter may emit green light, the third light emitter may emit green light, and the fourth light emitter emits blue light.

An electroluminescent element according to yet another exemplary embodiment of the present disclosure includes: a first light emitting element provided with a first light emitter emitting light of a first color, and a color filter layer disposed to overlap the first light emitter and having a first color filter of a second color different from the first color and a second color filter of a third color different from the first and second colors, the first color filter and the second color filter being disposed to be adjacent to each other; and a second light emitting element provided with a second light emitter disposed to overlap the first light emitter and the color filter layer and emitting light of a fourth color different from the first to third colors, wherein light emitted from the first light emitting element is emitted through the color filter layer and the second light emitting element.

In the exemplary embodiment, the first light emitting element may include: a first electrode disposed on a first surface of the first light emitter, and a second electrode disposed on a second surface opposite to the first surface of the first light emitter so as to face the first electrode; the second light emitting element may include a third electrode disposed on a first surface of the second light emitter, and a fourth electrode disposed on a second surface opposite to the first surface of the second light emitter so as to face the third electrode; and the color filter layer may be disposed between the second electrode and the third electrode.

In addition, the first electrode may be a first anode electrode that reflects light from the first light emitter, the second electrode may be a first cathode electrode that transmits a part of light emitted from the first light emitter, the third electrode may be a second cathode electrode that transmits a part of light emitted from the first and second color filters, and the fourth electrode may be a second anode electrode that transmits light emitted from the second light emitter.

In addition, the first light emitter may emit yellow light, the first color filter is a red color filter, the second color filter may be a green color filter, and the second light emitter may emit blue light.

In addition, the first light emitter may emit cyan light, the first color filter may be a blue color filter, the second color filter may be a green color filter, and the second light emitter may emit red light.

In addition, the first light emitter may emit magenta light, the first color filter may be a red color filter, the second color filter may be a blue color filter, and the second light emitter may emit green light.

In the above exemplary embodiments, the first anode electrode may be formed of any one selected from a three-layer structure of Ni, Cr, Al, Ag, and ITO/Ag/ITO, and a two-layer structure of Al/ITO; the first cathode electrode and the second cathode electrode may be formed of any one selected from a two-layer structure of Ca/Ag, an alloy of Li:Al, and an alloy of Mg:Ag; and the second anode electrode may be formed of any one selected from the three-layer structure of Ni, Cr, Al, Ag, and ITO/Ag/ITO, and the two-layer structure of Al/ITO.

In addition, the first light emitting element and the second light emitting element may be adhered to each other by a transparent conductive adhesive.

In addition, the transparent conductive adhesive may be formed as a composition of a transparent adhesive monomer, and conductive polymer material or ITO Nano powder; the transparent adhesive monomer may be selected from any one of acrylic monomers, epoxy monomers, ether monomers, and combinations thereof; and the conductive polymer may be selected from any one of polyacetylene, polypyrrole, polythiophene, poly (3-alkylthiophene), polyphenylene sulfide, polyparaphenylene sulfide, polyphenylene vinylene, polyparaphenylene vinylene, polythienylene vinylene, polyphenylene, polyparaphenylene, polyazulene, polyfuran, polyaniline, polyselenophene, polytelurofen, and combinations thereof.

An electroluminescent display device according to an exemplary embodiment of the present disclosure includes: a scan line and a data line disposed to cross each other; a switching thin film transistor that switches a data signal supplied through the data line in response to a scan signal supplied through the scan line; a storage capacitor that stores the data signal output from the switching thin film transistor as a data voltage; a driving thin film transistor that supplies a driving current according to the data voltage stored in the storage capacitor; and an electroluminescent element defined in the exemplary embodiments and emitting light according to the driving current.

As described above, although the exemplary embodiments of the present disclosure has been described in more detail with reference to the attached drawings, the present disclosure is not necessarily limited to the above exemplary embodiments, and various modifications can be made within the scope of the technical idea of the present disclosure. Therefore, the exemplary embodiments disclosed in the present disclosure are not intended to limit the technical idea of the present disclosure but to describe the present disclosure, and the scope of the technical idea of the present disclosure is not limited by these exemplary embodiments. Therefore, the exemplary embodiments described above are to be understood in all respects as illustrative and not restrictive. The scope of protection of the present disclosure should be interpreted by the following claims, and all technical ideas within the scope equivalent thereto should be construed as being included in the scope of the present disclosure.

What is claimed is:

1. An electroluminescent element comprising:
a first light emitting element provided with a first light emitter emitting light of a first color and a second light emitter emitting light of a second color different from the first color, the first light emitter and the second light emitter being disposed to be adjacent to each other; and
a second light emitting element provided with a third light emitter disposed to overlap the first light emitter and the second light emitter and emitting light of a third color different from the first color and the second color,
wherein light of the first color and the second color emitted from the first light emitting element is emitted through the second light emitting element,
wherein the first light emitting element includes a first electrode disposed on a first surface of the first light emitter and the second light emitter, and a second electrode disposed on a second surface opposite to the first surface of the first light emitter and the second light emitter so as to face the first electrode;

the second light emitting element includes a third electrode disposed on a first surface of the third light emitter, and a fourth electrode disposed on a second surface opposite to the first surface of the third light emitter so as to face the third electrode; and the second electrode and the third electrode are adhered to each other, and wherein the first electrode is a first anode electrode that reflects light from the first light emitter and the second light emitter, the second electrode is a first cathode electrode that transmits a part of each light emitted from the first light emitter and the second light emitter, the third electrode is a second cathode electrode that transmits a part of light emitted from the first cathode electrode, and the fourth electrode is a second anode electrode that transmits light emitted from the third light emitter.

2. The electroluminescent element of claim 1, wherein
the first anode electrode is formed of any one selected from a three-layer structure of Ni, Cr, Al, Ag, and ITO/Ag/ITO, and a two-layer structure of Al/ITO, the first cathode electrode and the second cathode electrode are formed of any one selected from a two-layer structure of Ca/Ag, an alloy of Li:Al, and an alloy of Mg:Ag, and the second anode electrode is formed of any one selected from the three-layer structure of Ni, Cr, Al, Ag, and ITO/Ag/ITO, and the two-layer structure of Al/ITO.

3. The electroluminescent element of claim 1, wherein the first light emitter emits red light, the second light emitter emits blue light, and the third light emitter emits green light.

4. The electroluminescent element of claim 1, wherein the first light emitter emits red light, the second light emitter emits green light, and the third light emitter emits blue light.

5. The electroluminescent element of claim 1, wherein the first light emitter emits green light, the second light emitter emits blue light, and the third light emitter emits red light.

6. The electroluminescent element of claim 1, wherein the first light emitting element and the second light emitting element are adhered to each other by a transparent conductive adhesive.

7. The electroluminescent element of claim 6, wherein
the transparent conductive adhesive is formed as a composition of a transparent adhesive monomer, and conductive polymer material or ITO Nano powder, the transparent adhesive monomer is selected from any one of acrylic monomers, epoxy monomers, ether monomers, and combinations thereof, and the conductive polymer is selected from any one of polyacetylene, polypyrrole, polythiophene, poly (3-alkylthiophene), polyphenylene sulfide, polyparaphenylene sulfide, polyphenylene vinylene, polyparaphenylene vinylene, polythienylene vinylene, polyphenylene, polyparaphenylene, polyazulene, polyfuran, polyaniline, polyselenophene, polytelurofen, and combinations thereof.

8. An electroluminescent display device comprising:
a scan line and a data line disposed to cross each other;
a switching thin film transistor that switches a data signal supplied through the data line in response to a scan signal supplied through the scan line;
a storage capacitor that stores the data signal output from the switching thin film transistor as a data voltage;
a driving thin film transistor that supplies a driving current according to the data voltage stored in the storage capacitor; and
the electroluminescent element of claim 1 and emitting light according to the driving current.

9. An electroluminescent element comprising:
a first light emitting element provided with a first light emitter emitting light of a first color, and a second light emitter emitting light of a second color different from the first color, the first light emitter and the second light emitter being disposed to be adjacent to each other; and
a second light emitting element provided with a third light emitter disposed to overlap the first light emitter and emitting light of the second color, and a fourth light emitter disposed to overlap the second light emitter and emitting light of a third color, the third light emitter and the fourth light emitter being disposed to be adjacent to each other,
wherein light emitted from the first light emitting element is emitted through the second light emitting element,
wherein the first light emitting element includes a first electrode disposed on a first surface of the first light emitter and the second light emitter, and a second electrode disposed on a second surface opposite to the first surface of the first light emitter and the second light emitter so as to face the first electrode,
the second light emitting element includes a third electrode disposed on a first surface of the third light emitter and the fourth light emitter, and a fourth electrode disposed on a second surface opposite to the first surface of the third light emitter and the fourth light emitter so as to face the third electrode; and
the second electrode and the third electrode are adhered to each other, and
wherein the first electrode is a first anode electrode that reflects light from the first and second light emitters,
the second electrode is a first cathode electrode that transmits a part of each light emitted from the first and second light emitters,
the third electrode is a second cathode electrode that transmits a part of light emitted from the first cathode electrode, and
the fourth electrode is a second anode electrode that transmits light emitted from the third light emitter.

10. The electroluminescent element of claim 9, wherein the first light emitter emits red light, the second light emitter emits blue light, the third light emitter emits blue light, and the fourth light emitter emits green light.

11. The electroluminescent element of claim 9, wherein the first light emitter emits red light, the second light emitter emits green light, the third light emitter emits green light, and the fourth light emitter emits blue light.

12. An electroluminescent element comprising:
a first light emitting element provided with a first light emitter emitting light of a first color, and a color filter layer disposed to overlap the first light emitter and having a first color filter of a second color different from the first color and a second color filter of a third color different from the first and second colors, the first color filter and the second color filter being disposed to be adjacent to each other; and
a second light emitting element provided with a second light emitter disposed to overlap the first light emitter and the color filter layer and emitting light of a fourth color different from the first to third colors, wherein light emitted from the first light emitting element is emitted through the color filter layer and the second light emitting element.

13. The electroluminescent element of claim 12, wherein the first light emitting element includes a first electrode disposed on a first surface of the first light emitter, and a second electrode disposed on a second surface opposite to the first surface of the first light emitter so as to face the first electrode, the second light emitting element includes a third electrode disposed on a first surface of the second light emitter, and a fourth electrode disposed on a second surface opposite to the first surface of the second light emitter so as to face the third electrode, and the color filter layer is disposed between the second electrode and the third electrode.

14. The electroluminescent element of claim 13, wherein the first electrode is a first anode electrode that reflects light from the first light emitter, the second electrode is a first cathode electrode that transmits a part of light emitted from the first light emitter, the third electrode is a second cathode electrode that transmits a part of light emitted from the first and second color filters, and the fourth electrode is a second anode electrode that transmits light emitted from the second light emitter.

15. The electroluminescent element of claim 14, wherein the first light emitter emits yellow light, the first color filter is a red color filter, the second color filter is a green color filter, and the second light emitter emits blue light.

16. The electroluminescent element of claim 14, wherein the first light emitter emits cyan light, the first color filter is a blue color filter, the second color filter is a green color filter, and the second light emitter emits red light.

17. The electroluminescent element of claim 14, wherein the first light emitter emits magenta light, the first color filter is a red color filter, the second color filter is a blue color filter, and the second light emitter emits green light.

* * * * *